(12) United States Patent
Yoshitake (10) Patent No.: US 6,281,565 B1
(45) Date of Patent: Aug. 28, 2001

(54) SEMICONDUCTOR DEVICE AND METHOD FOR PRODUCING THE SAME

(75) Inventor: Nobuyuki Yoshitake, Kagoshima (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/215,312

(22) Filed: Dec. 18, 1998

(30) Foreign Application Priority Data

Dec. 25, 1997 (JP) ................................. P09-357918

(51) Int. Cl.[7] .......................... H01L 27/082; H01L 29/73
(52) U.S. Cl. ................................ 257/590; 257/370
(58) Field of Search .................................. 257/370, 371, 257/378, 566, 590

(56) References Cited

U.S. PATENT DOCUMENTS

| 5,319,234 | * | 6/1994 | Uga et al. | 257/369 |
|---|---|---|---|---|
| 5,504,368 | * | 4/1996 | Sawada | 257/556 |
| 5,856,695 | * | 1/1999 | Ito et al. | 257/370 |

* cited by examiner

Primary Examiner—Eddie Lee
Assistant Examiner—Allan R. Wilson
(74) Attorney, Agent, or Firm—Sonnenschein, Nath & Rosenthal

(57) ABSTRACT

A semiconductor device comprising an isolating layer (diffusion layer) having a deep depth which can be produced with improved productivity and a method of the same. The semiconductor device comprises a semiconductor substrate of a first conductivity type; a first diffusion layer of a second conductivity type formed in the semiconductor substrate; a first semiconductor layer formed on the semiconductor substrate; a second diffusion layer of the second conductivity type formed in the first semiconductor layer and connected to the first diffusion layer; and a second semiconductor layer formed on the first semiconductor layer; the second semiconductor layer being electrically isolated from the semiconductor substrate by the first diffusion layer and the second diffusion layer.

2 Claims, 7 Drawing Sheets

SEMICONDUCTOR DEVICE AND METHOD FOR PRODUCING THE SAME

BACKGROUND OF THE INVENTION

1. Field of the Invention

The present invention relates to a semiconductor device and a method for producing the same, more specifically relates to a semiconductor device having a bipolar transistor and methods for producing the same.

2. Description of the Related Art

Transistors used in semiconductor devices can be roughly divided into metal-oxide-semiconductor field effect transistors (MOSFET) and bipolar transistors. MOSFET's include n-channel MOSFET's, p-channel MOSFET's, and complementary MOSFET's (CMOSFET's) using the two. On the other hand, bipolar transistors include npn junction type transistors and pnp junction type transistors. A bipolar transistor is capable of operating at a high speed compared with a MOSFET because the bipolar transistor itself operates at a high speed. Further, the transfer conductance of a bipolar transistor is large, and the ability to drive a capacitive load is large.

Figure 1A:
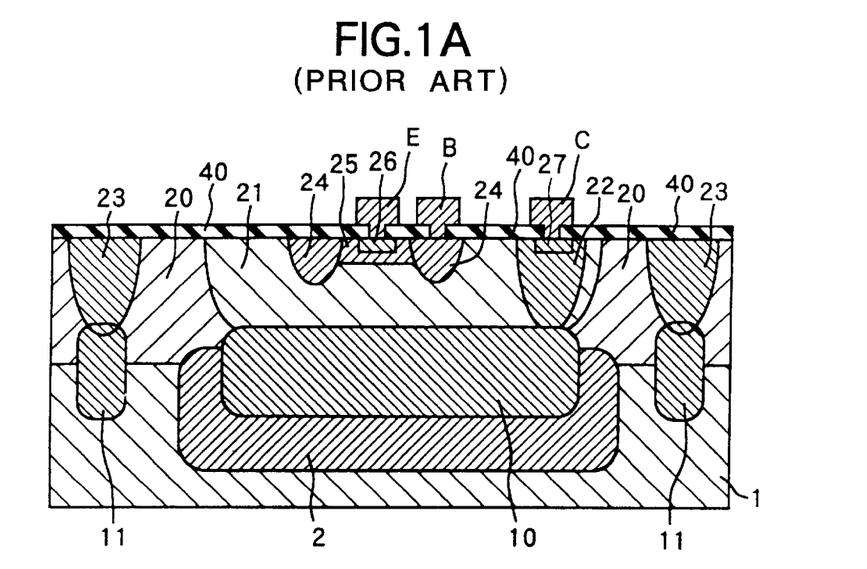
FIG. 1A is a cross-sectional view of a semiconductor device according to the related art.

Among the above bipolar transistors, a longitudinal pnp junction type bipolar transistor having a high withstand voltage is cross-sectionally shown in FIG. 1A as an example of the related art. An n-type epitaxial layer 20 is formed on a p-type semiconductor substrate 1 and covered with an insulating film 40. In a region where elements are electrically insulated (isolated) by a p$^+$-type buried layer 11 and p$^+$-type isolating layer 23, an n$^-$-type pocket 2 is formed from near an interface between the p-type semiconductor substrate 1 and n-type epitaxial layer 20 to the p-type semiconductor substrate 1. A p$^+$-type buried layer 10 is formed on the n$^-$-type pocket 2 and is connected to a p-type well 21 which reaches from the surface of the n-type epitaxial layer 20 to the p$^+$-type buried layer 10. An N$^+$-type graft base 24 and n-type base 25 are formed in the p-type well 21 and are connected to a base take-out electrode B from the opening portion of the insulating film 40. Also, a p$^+$-type emitter 26 is formed in the n-type base 25 and is connected to an emitter take-out electrode E. On the other hand, a p$^+$-type plug 22 is formed in the p-type well 21 so as to be connected to the p$^+$-type buried layer 10, and a p$^+$-type collector 27 is formed in the p$^+$-type plug 22 and is connected to a collector take-out electrode C.

In the above longitudinal pnp junction type bipolar transistor having a high withstand voltage, in a practical usage, a power source voltage is supplied to the n$^-$-type pocket 2, a ground voltage is supplied to the p-type semiconductor substrate 1, and a voltage from the ground to a power source voltage is supplied to the p$^+$-type buried layer 10 which becomes the collector region. For use under a high power source voltage, it is necessary to set the breakdown withstand voltage high at junctions between the n$^-$-type pocket 2 and p$^+$-type buried layer 10, the p-type semiconductor substrate 1 and p$^+$-type buried layer 10, and the n$^-$-type pocket 2 and p-type semiconductor substrate 1.

Figure 1B:
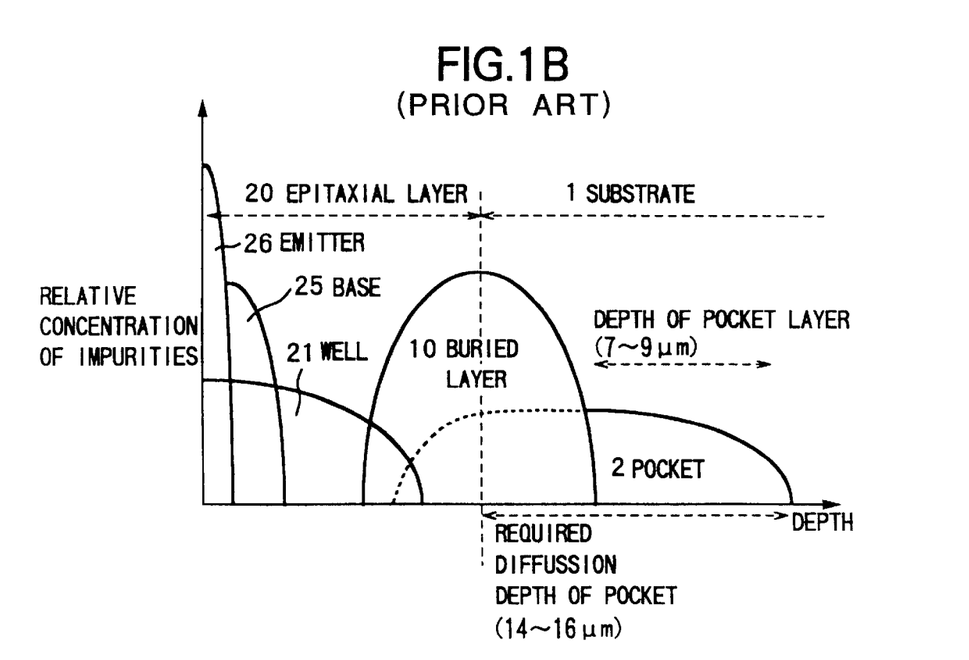
FIG. 1B is a view showing a profile of relative concentrations of impurities in a diffusion layer of the semiconductor device shown in FIG. 1A.

Here, the relative concentrations of conductive impurities of each layer are shown in FIG. 1B. The p$^+$-type buried layer 10 which becomes the collector region is a region where most of the collector current flows and is normally formed to include high concentrations of p-type conductive impurities in order to lower the collector resistance. Also, at a pn junction, the lower the concentrations of conductive impurities of either of the p-side or n-side, the higher the breakdown withstand voltage, therefore the n$^-$-type pocket 2 is formed to include n-type conductive impurities at low concentrations.

Furthermore, the withstand voltage between the p-type semiconductor substrate 1 and p$^+$-type buried layer 10 changes according to the total amount of conductive impurities included in the n$^-$-type pocket 2 formed between them. The smaller the total amount of the conductive impurities, the easier a punch through occurs and the withstand voltage declines. Accordingly, for the n$^-$-type pocket 2, it is necessary to raise the total amount of the conductive impurities while including conductive impurities at low concentrations. Therefore, it is necessary to form the n$^-$-type pocket 2 to have a deep depth. For example, to obtain a withstand voltage of the 100V level, it is necessary to make the peak concentration of the n$^-$-type pocket 2 about $1\times10^{16}$/cm$^{-3}$ and the depth more than 7 to 9 μm.

Figure 2A:
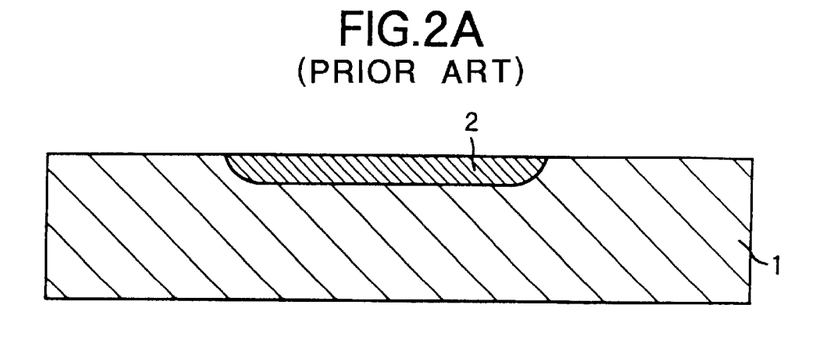
FIG. 2A shows the procedure up to forming an n$^-$-type pocket.

A method for producing the above longitudinal pnp junction type bipolar transistor having a high withstand voltage will be explained. First, as shown in FIG. 2A, an n$^-$-type pocket 2 is formed by ion implantation of n-type conductive impurities into the p-type semiconductor substrate 1.

Figure 2B:
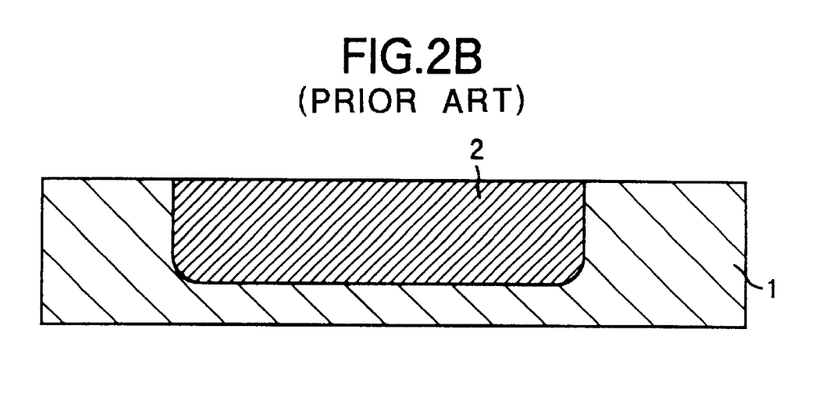
FIG. 2B shows the procedure up to diffusion process of the n$^-$-type pocket.

Next, as shown in FIG. 2B, conductive impurities are diffused in the n$^-$-type pocket 2 to reach at least a depth of 14 to 16 μm from the surface of the p-type semiconductor substrate 1 by a heating process at high temperature for a long time, for example, at 1200° C. for 100 hours. As a result, the depth of the n$^-$-type pocket 2 can be made more than 7 to 9 μm at the time when a p$^+$-type buried layer is formed in a later procedure.

Figure 2C:
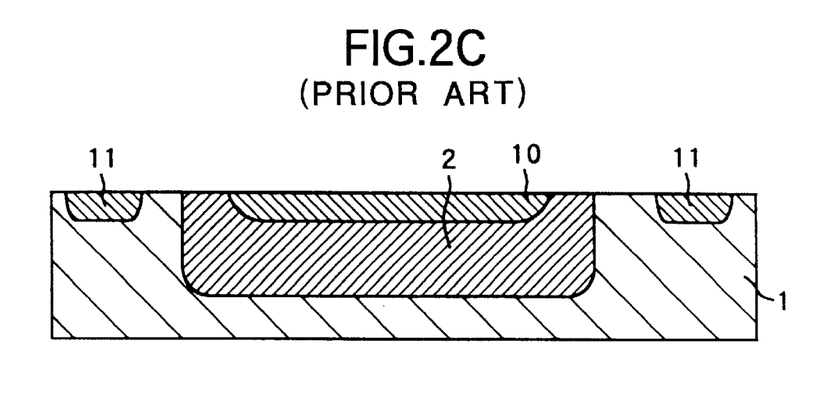
FIG. 2C shows the procedure up to forming a p$^+$-type buried layer.

Next, as shown in FIG. 2C, a p$^+$-type buried layer 10 is formed in the n$^-$-type pocket 2 and a p$^+$-type buried layer 11 for element isolation is formed in an element isolating region by ion implantation of p-type conductive impurities and diffusion by a heating process.

Figure 2D:
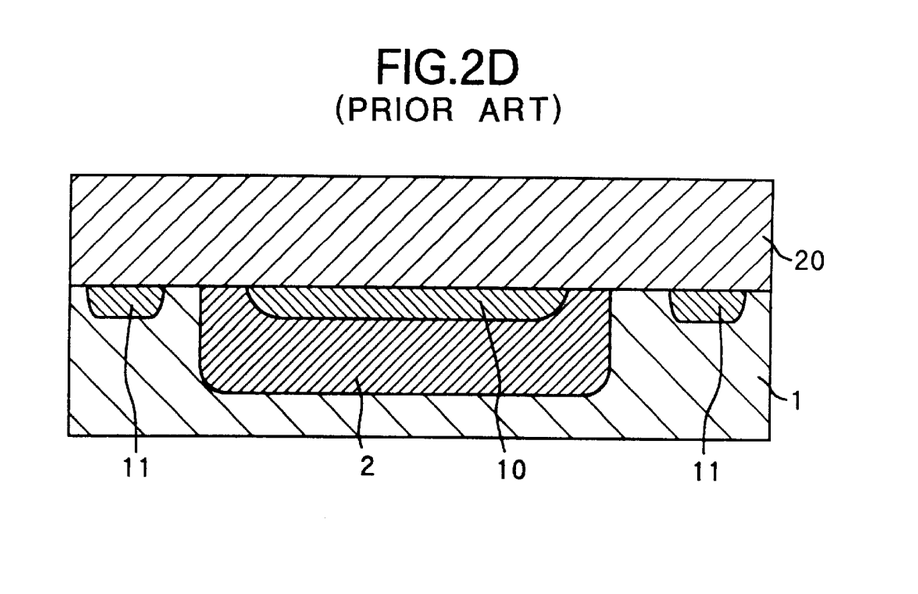
FIG. 2D shows the procedure up to forming an n-type epitaxial layer.

Next, as shown in FIG. 2D, an n-type epitaxial layer 20 is formed by epitaxial growth at the upper layer of the p-type semiconductor substrate 1.

Figure 2E:
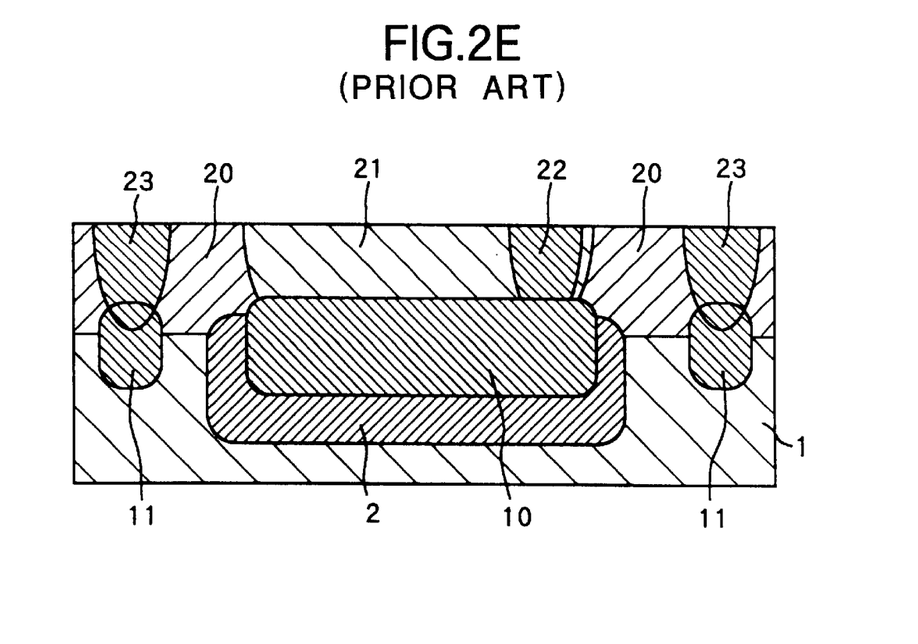
FIG. 2E shows the procedure up to forming a p$^+$-type plug and p$^+$-type isolating layer.

Next, as shown in FIG. 2E, a p-type well 21 is formed which reaches to the p$^+$-type buried layer 10 from the surface of the n-type epitaxial layer 20. Further, a p$^+$-type plug 22 which reaches to the p$^+$-type buried layer 10 in the p-type well 21 and a p$^+$-type isolating layer 23 reaching to the p$^+$-type buried layer 11 in the element isolating region are formed respectively by ion implantation of p-type conductive impurities and diffusion by a heating process.

The succeeding steps include, for example, forming an n$^+$-type graft base 24 and n-type base 25 in the p-type well 21, forming a p$^+$-type emitter 26 in the n-type base 25, forming a p$^+$-type collector 27 in the p$^+$-plug 22, forming a base take-out electrode B, emitter take-out electrode E, and collector take-out electrode C respectively connected to them, and thereby forming a longitudinal pnp junction type bipolar transistor having a high withstand voltage shown in FIG. 1A.

In the above method of production of a longitudinal pnp junction type bipolar transistor having a high withstand voltage of the related art, however, a high temperature, long heating process of, for example, 1200° C. and 100 hours, is required to form the n$^-$-type pocket 2 including conductive impurities at low concentrations and having a deep depth. As a result, the productivity is remarkably low due to the long period for completion and low processing performance of a diffusion reactor.

To shorten the above long processing time for the heating process, the method of raising the temperature of the heating process can be considered, however, an ordinary quartz reactor core tube easily deforms due to a high temperature process so has to be exchanged frequently and the productivity declines. Also, a method of using carbonized silicon (SiC) as a reactor core tube which is hard to deform can be considered, however, in reality there is a disadvantage that it is difficult to prepare a tube with a large diameter.

SUMMARY OF THE INVENTION

An object of the present invention is to provide a semiconductor device comprising an isolating layer (diffusion layer) having a deep depth which can be produced with improved productivity and a method of production of the same.

To achieve the above object, according to a first aspect of the present invention, there is provided a semiconductor device comprising a semiconductor substrate of a first conductivity type; a first diffusion layer of a second conductivity type formed in the semiconductor substrate; a first semiconductor layer formed on the semiconductor substrate; a second diffusion layer of the second conductivity type formed in the first semiconductor layer and connected to the first diffusion layer: and a second semiconductor layer formed on the first semiconductor layer; the second semiconductor layer being electrically isolated from the semiconductor substrate by the first diffusion layer and the second diffusion layer.

In the above semiconductor device of the present invention, a first diffusion layer and a second diffusion layer of the second conductivity type formed in the first conductivity type semiconductor substrate and the first semiconductor layer can function as isolating layers which isolate the semiconductor substrate and the second semiconductor layer. This utilizes the fact that an inversely biased pn junction has high resistance. Since it is possible to form an isolating layer having a deep depth of the related art by separating it into a first diffusion layer and a second diffusion layer, the respective first and second diffusion layers can be formed shallow. Since the first and second diffusion layers can be formed in a shorter time than an isolating layer forming process in the related art, it becomes possible to shorten the time of the production process for forming the isolating layer and the productivity improves. Since there is no need to raise the heat treatment temperature, the problem of the reactor core tube easily deforming does not arise.

In the semiconductor device of the present invention, preferably, the first semiconductor layer is a stacked layer of a plurality of semiconductor layers and the second diffusion layer comprises a plurality of diffusion layers of the second conductivity type formed in each of the plurality of semiconductor layers. As a result, each of the diffusion layers comprising the second diffusion layer can be formed further shallower, the amount of the heat treatment for forming an isolating layer comprised by the first and the second diffusion layers can be reduced, and therefore the temperature of the heating treatment can be lowered and the processing time can be further shortened.

Preferably, in the above semiconductor device of the present invention, a bipolar transistor is formed, said bipolar transistor comprising a buried layer of the first conductivity type functioning as a collector region formed at an upper layer of the second diffusion layer, a well of the first conductivity type formed at an upper layer of the buried layer and connected to the buried layer, a base region of the second conductivity type formed in the well, and an emitter region of the first conductivity type formed in the base region. A bipolar transistor can be configured comprising a collector region, base region, and emitter region.

Preferably, in the above semiconductor device of the present invention, a field effect transistor is formed, said field effect transistor comprising a gate insulating film formed at an upper layer of the second semiconductor layer, a gate electrode formed at an upper layer of the gate insulating film, and source and drain regions formed in the second semiconductor layer at the two side parts of the gate electrode.

According to a second aspect of the present invention, there is provided a method for producing a semiconductor device including the steps of: forming a first diffusion layer of a second conductivity type in a semiconductor substrate of a first conductivity type; forming a first semiconductor layer on the semiconductor substrate; forming a second diffusion layer of the second conductivity type in the first semiconductor layer to connect to the first diffusion layer; and forming a second semiconductor layer at an upper layer of the first semiconductor; the first diffusion layer and the second diffusion layer being made isolating layers of the semiconductor substrate and the second semiconductor layer.

According to the above method for producing a semiconductor device of the present invention, since it is possible to form an isolating layer having a deep depth by separating it into first and second diffusion layers, it is possible to form the first and second diffusion layers shallow. The first and second diffusion layers can be formed in a shorter time than in a forming process of the related art, so the time for the production process for forming an isolating layer can be made short and the productivity improves. Since it is unnecessary to raise the temperature of the heating process, the problem of the reactor core tube easily deforming does not arise.

Preferably, in the method of producing a semiconductor device of the present invention, in the steps of forming the first semiconductor layer and forming the second diffusion layer, a stacked layer of a plurality of semiconductor layers is formed as the first semiconductor layer and a plurality of diffusion layers of the second conductivity type are formed in each of the plurality of semiconductor layers as the second diffusion layer by repeating two times or more the steps of forming a semiconductor layer and forming a diffusion layer of the second conductivity type in the semiconductor layer. As a result, the diffusion layers comprising the second diffusion layer can be formed further shallower, so the amount of the heating process for forming an isolating layer comprised of the first and second diffusion layers can be reduced, the temperature of the heating process can be lowered, and the time for processing can be shortened as well.

Preferably, the method of producing the above semiconductor device of the present invention further includes, between the step of forming the second diffusion layer and before the step of forming the second semiconductor layer, a step of forming a buried layer of the first conductivity type which becomes a collector region and further includes, after the step of forming the second semiconductor layer, a step of forming a well of the first conductivity type connected to the buried layer of the first conductivity type, a step of forming a base region of the second conductivity type in the well, and a step of forming an emitter region of the first conductivity type in the base region, to thereby form a bipolar transistor. As a result, it is possible to form a bipolar transistor which comprises a collector region, base region, and emitter region in the second semiconductor layer.

Preferably, the method of producing the above semiconductor device of the present invention further includes, after the step of forming the second semiconductor layer, a step of forming a gate insulating film at an upper layer of the second semiconductor layer, a step of forming a gate electrode at an upper layer of the gate insulating film, and a step of forming source and drain regions in the second semiconductor layer at the two side parts of the gate electrode, to thereby form a field effect transistor. As a result, it is possible to form a field effect transistor which comprises a gate insulating film, gate electrode and source and drain regions in the second semiconductor layer.

BRIEF DESCRIPTION OF THE DRAWINGS

These and other objects and features of the present invention will become clearer from the following description of the preferred embodiments given with reference to the accompanying drawings, in which:

FIGS. 2A to 2E are cross-sectional views showing the steps of a method for producing a semiconductor device according to the related art, where

FIGS. 4A to 4F are cross-sectional views showing the steps of a method for producing a semiconductor device according to a first embodiment of the present invention, where

DESCRIPTION OF THE PREFERRED EMBODIMENTS

Below, preferred embodiments will be described with reference to the accompanying drawings.

First Embodiment

Figure 3A:
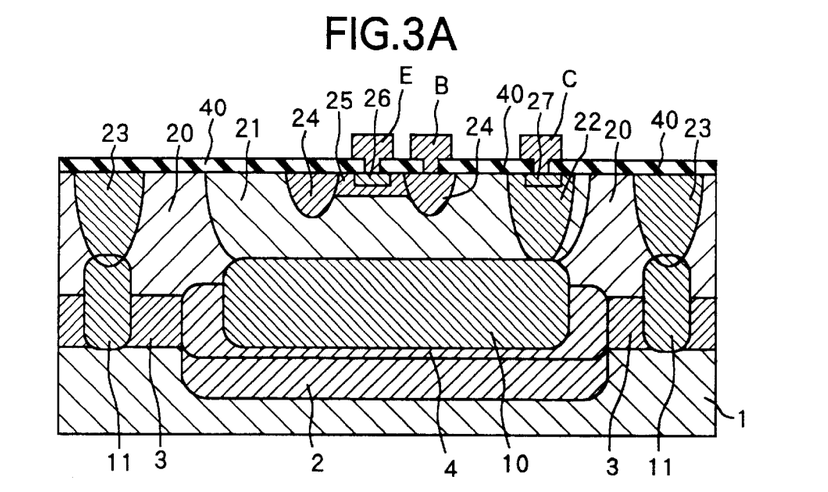
FIG. 3A is a cross sectional view of a semiconductor device according to a first embodiment of the present invention.

FIG. 3A is a cross-sectional view of a semiconductor device comprising a longitudinal pnp junction type bipolar transistor having a high withstand voltage of the present embodiment. A first n-type epitaxial layer (first semiconductor layer) 3 and a second n-type epitaxial layer (second semiconductor layer) 20 are formed and stacked on a p-type semiconductor substrate 1 and covered with an insulating film 40. In a region where elements are electrically insulated (isolated) by a p$^+$-type buried layer 11 and p$^+$-type isolating layer 23, a first n$^-$-type pocket 2 is formed from near an interface between the p-type semiconductor substrate 1 and a first n-type epitaxial layer 3 to the p-type semiconductor substrate 1. A second n$^-$-type pocket 4 is formed in the first n-type epitaxial layer 3. The first n$^-$-type pocket 2 and the second n$^-$-type pocket 4 are connected by having an overlapping region with each other.

Also, a p$^+$-type buried layer 10 is formed at an upper layer of the second n$^-$-type pocket 4 and is connected to a p-type well 21 which reaches to the p$^+$-type buried layer 10 from the surface of the second n-type epitaxial layer 20. An n$^+$-type graft base 24 and n-type base 25 are formed in the p-type well 21 and are connected to a base take-out electrode B from an opening portion of the insulating film 40. Also, a p$^+$-type emitter 26 is formed in an n-type base 25 and is connected to an emitter take-out electrode E. On the other hand, a p$^+$-type plug 22 is formed so as to be connected to a p$^+$-type buried layer 10 in the p-type well 21. A p$^+$-type collector 27 is formed in the p$^+$-type plug 22 and is connected to a collector take-out electrode C.

In a semiconductor device comprising the above longitudinal pnp junction type bipolar transistor having a high withstand voltage of the present invention, the first n$^-$-type pocket 2 and the second n$^-$-type pocket 4 formed in the p-type semiconductor substrate 1 and the first n-type epitaxial layer 3 can function as isolating layers to isolate the p-type semiconductor substrate 1 and the second n-type epitaxial layer 20. This utilizes the fact that an inversely biased pn junction has a high resistance. For example, a power source voltage is supplied to the first n$^-$-type pocket 2 and the second n$^-$-type pocket 4, a ground voltage is supplied to the p-type semiconductor substrate 1, and a voltage from the ground voltage to power source voltage is supplied to the p$^+$-type buried layer 10, respectively, when being used.

Figure 3B:
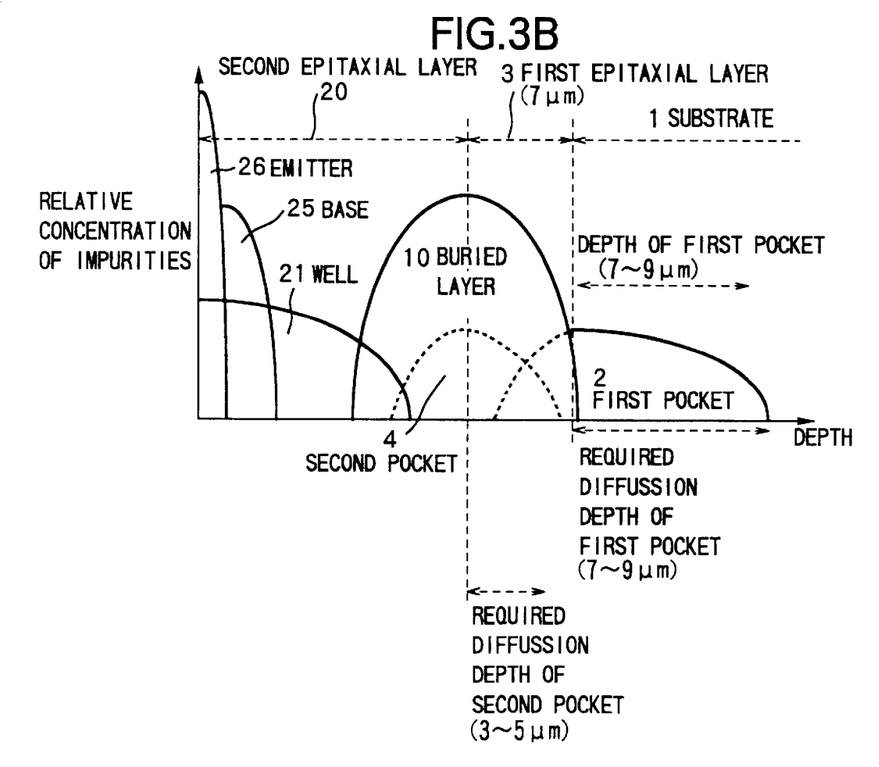
FIG. 3B is a view showing a profile of relative concentrations of impurities in a diffusion layer of the semiconductor device shown in FIG. 3A.

Here, relative concentrations of conductive impurities in the respective layers are shown in FIG. 3B. The p$^+$-type buried layer 10 which becomes a collector region is a region where most of a collector current flows and is normally formed to include p-type conductive impurities at high concentrations in order to lower the collector resistance. Also, at a pn junction, the lower the concentrations of conductive impurities of either one of the p-side or n-side, the higher the breakdown withstand voltage. Therefore, the first n$^-$-type pocket 2 and the second n$^-$-type pocket 4 are formed to include n-type conductive impurities at low concentrations.

Also, the withstand voltage between the p-type semiconductor substrate 1 and p$^+$-type buried layer 10 changes according to a total amount of conductive impurities included in the first n$^-$-type pocket 2 and the second n$^-$-type pocket 4 formed between them. The isolating layers comprised of the first n -type pocket 2 and the second n$^-$-type pocket 4 have deep depths, the total amount of the conductive impurities included in the first n$^-$-type pocket 2 and the second n$^-$-type pocket 4 can be made more than a sufficient value, and thus a punch through withstand voltage can be improved. For example, by setting a peak concentration to about $1\times10^{16}$/cm$^-$and the depth of the first n$^-$-type pocket 2 to more than 7 to 9 $\mu$m, a withstand voltage of the 100V level can be obtained.

Figure 4A:
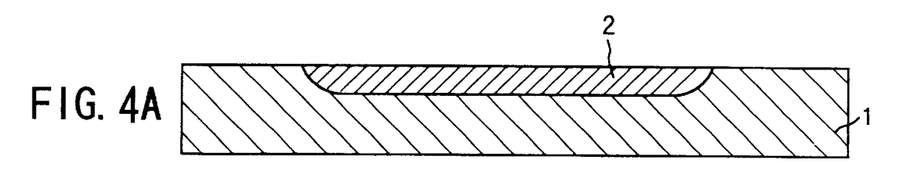
FIG. 4A shows the procedure up to forming a first n$^-$-type pocket.

A method for producing a semiconductor device of the above first embodiment will be explained next. First, as shown in FIG. 4A, a first n⁻-type pocket 2 is formed by ion implantation of n-type conductive impurities into the p-type semiconductor substrate 1 and diffusion by a heating process.

Figure 4B:
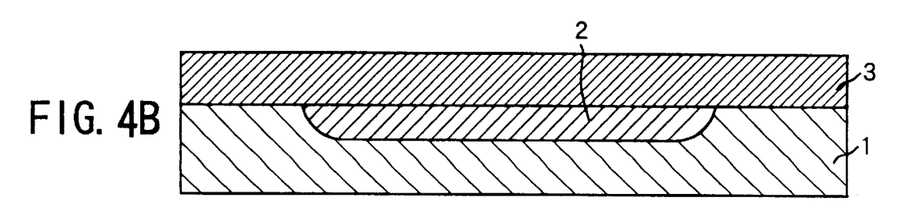
FIG. 4B shows the procedure up to forming a first n-type epitaxial layer.

Next, as shown in FIG. 4B, a first n-type epitaxial layer (first semiconductor layer) 3 is formed by epitaxial growth at the upper layer of the p-type semiconductor substrate 1.

Figure 4C:
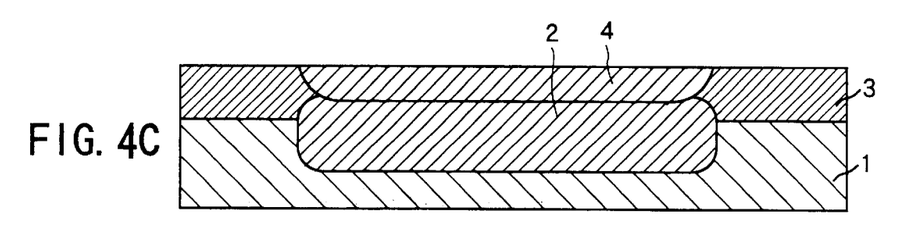
FIG. 4C shows the procedure up to forming a second n$^-$-type pocket.

Next, as shown in FIG. 4C, n-type conductive impurities are implanted into the first n-type epitaxial layer 3 and the conductive impurities are made to diffuse by a heating process to form a second n⁻-type pocket 4 so as to be connected to the first n⁻-type pocket 2. At this time, when assuming the film thickness of the first n-type epitaxial layer 3 to be 7 μm, the conductive impurities can be diffused by a heating process of for example 1200° C. and about 20 hours.

Figure 4D:
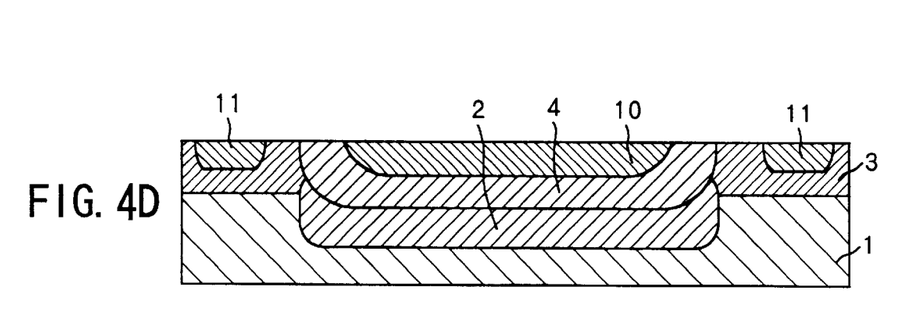
FIG. 4D shows the procedure up to forming a p$^+$-type buried layer.

Next, as shown in FIG. 4D, a p⁺-type buried layer 10 is formed in the second n⁻-type pocket 4 and a p⁺-type buried layer 11 for isolating elements is formed in an element isolating region by ion implantation of p-type conductive impurities and diffusion by a heating process.

Figure 4E:
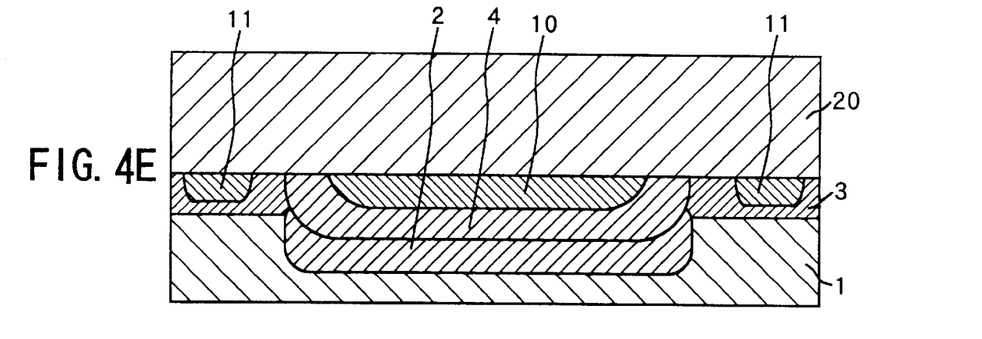
FIG. 4E shows the procedure up to forming a second n-type epitaxial layer.

Next, as shown in FIG. 4E, a second n-type epitaxial layer 20 is formed on the first n-type epitaxial layer 3 by epitaxial growth.

Figure 4F:
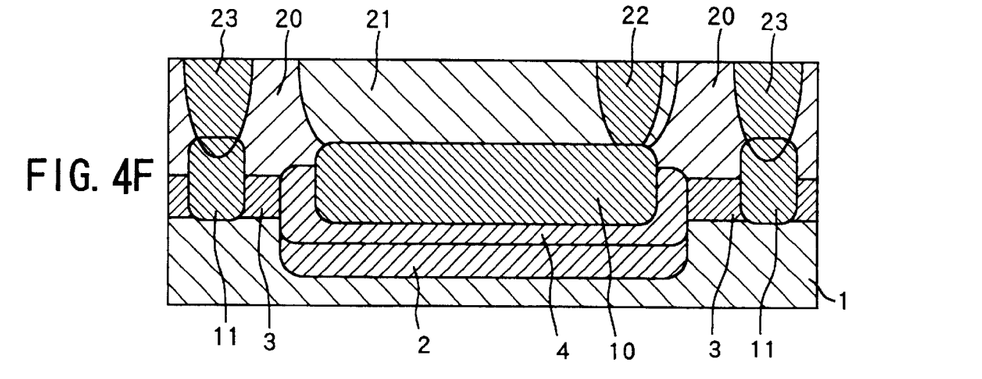
FIG. 4F shows the procedure up to forming a p$^+$-type plug and p$^+$-type isolating layer.

Next, as shown in FIG. 4F, p-type conductive impurities are implanted and diffused by a heating process to form a p-type well 21 which reaches to the p⁺-type buried layer 10 from the surface of the second n-type epitaxial layer 20 and further to form a p⁺-type plug 22 which reaches to the p⁺-type buried layer 10 in the p-type well 21 and a p⁺-type isolating layer 23 which reaches to the p⁺-type buried layer 11 in the element isolating region. In this heating process, the impurities included in the p⁺-type buried layers 10 and 11 etc. are also diffused in the second n-type epitaxial layer 20 and form the diffusion layers shown in FIG. 4F.

The succeeding steps include, for example, forming an n⁺-type graft base 24 and n-type base 25 in the p-type well 21, forming a p⁺-type collector 27 in the p⁺-type plug 22, forming an insulating film 40 of silicon oxide using, for example, a chemical vapor deposition (CVD) method, diffusing and activating the impurities by a heating process, then forming a p⁺-type emitter 26 in an n-type base 25, selectively providing openings of a base region, emitter region, and collector region in the insulating film 40, and forming a base take-out electrode B, emitter take-out electrode E, and collector take-out electrode C respectively connected to the regions. As a result, the longitudinal pnp junction type bipolar transistor having a high withstand voltage shown in FIG. 3A is formed. A desired semiconductor device can be made by further forming upper layer interconnections etc.

The above semiconductor device comprising the longitudinal pnp junction type bipolar transistor having a high withstand voltage of the first embodiment can be formed by separating the diffusion layer of the related art which has a deep depth into two parts, that is, the first n⁻-type pocket 2 and second n⁻-type pocket 4. Therefore, it becomes possible to form the respective first n⁻-type pocket 2 and second n⁻-type pocket 4 to be shallower. The first n⁻-type pocket 2 and second n⁻-type pocket 4 can be formed in a shorter time than in the procedure for forming diffusion layers of the related art, so the time for the production process can be shortened and the productivity improves. Since it is not necessary to raise the temperature of the heating process, there is no problem of the reactor core tube easily deforming.

Second Embodiment

Figure 5:
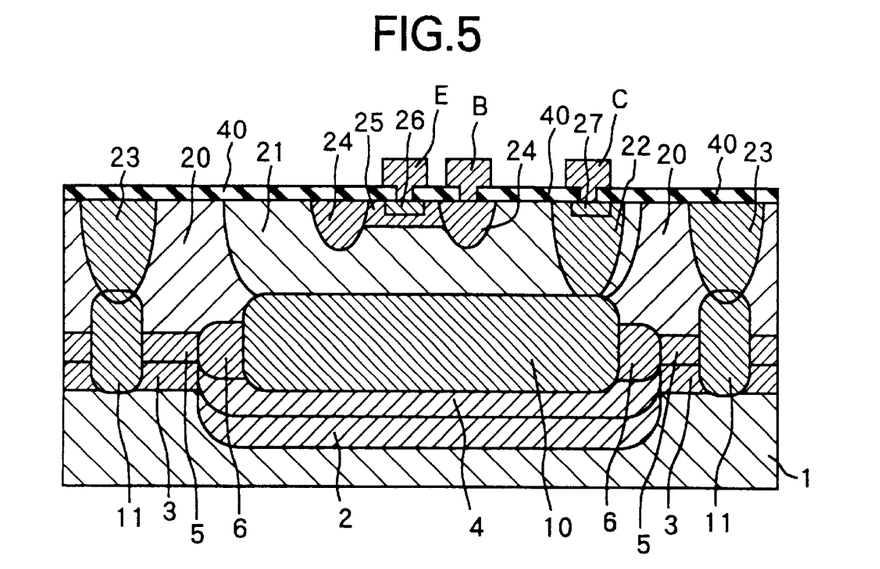
FIG. 5 is a cross-sectional view of a semiconductor device according to a second embodiment of the present invention.

FIG. 5 is a cross-sectional view of a semiconductor device comprising a longitudinal pnp junction type bipolar transistor having a high withstand voltage of the second embodiment. This semiconductor device is substantially the same as the one in the first embodiment. The different points are that the first semiconductor layer formed at the upper layer of the p-type semiconductor substrate 1 is a stacked layer of a first n-type epitaxial layer 3 at the lower side and a first n-type epitaxial layer 5 at the upper side, a lower side second n⁻-type pocket 4 is formed in the lower side n-type epitaxial layer 3, an upper side second n⁻-type pocket 6 is formed in the upper side first n-type epitaxial layer 5, and the first n⁻-type pocket 2, lower side second n⁻-type pocket 4, and upper side second n⁻-type pocket 6 are connected by having overlapping regions.

In the above semiconductor device of the second embodiment, in the same way as in the first embodiment, the first n⁻-type pocket 2, lower side second n⁻-type pocket 4, and upper second n⁻-type pocket 6 can function as isolating layers for isolating the p-type semiconductor substrate 1 and the second n-type epitaxial layer 20.

As a method for producing the semiconductor device of the second embodiment, a lower first n-type epitaxial layer 3 is formed on the p-type semiconductor substrate 1, then a lower side second n⁻-type pocket 4 is formed by ion implantation of conductive impurities and diffusion by a heating process, an upper first n-type epitaxial layer 5 is formed on the lower side second n⁻-type pocket 4, and an upper side second n⁻-type pocket 6 is formed by ion implantation of conductive impurities and diffusion by a heating process. The rest of the procedure is substantially the same as in the first embodiment.

According to the above method for producing a semiconductor device of the second embodiment, in the heating process for diffusion of the lower side second n⁻-type pocket 4 and upper side second n⁻-type pocket 6, when the thickness of the lower side first n-type epitaxial layer 3 is 5 μm and that of the upper side first n-type epitaxial layer 5 is 5 μm, diffusion can be carried out by a short heating process of 1200° C. and about 6 to 7 hours. In this case, in the process of forming the upper side first n-type epitaxial layer 5, the amount of impurities can be selected to attain a surface concentration of $1\times10^{16}/cm^{-3}$, and the time for diffusion can be about 30 minutes at 1000° C.

Third Embodiment

Figure 6:
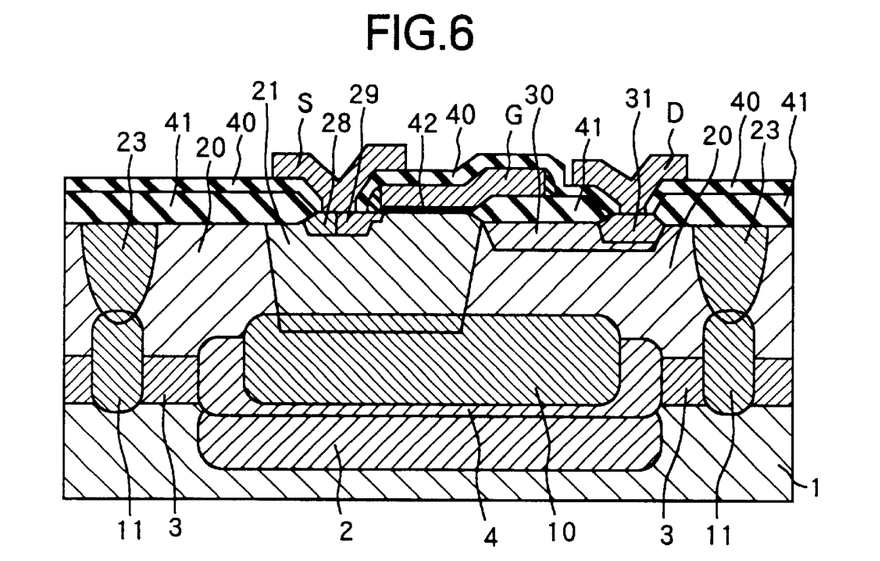
FIG. 6 is a cross-sectional view of a semiconductor device according to a third embodiment of the present invention.

FIG. 6 is a cross-sectional view of a semiconductor device comprising a field effect MOS transistor having a high withstand voltage of a third embodiment. In this semiconductor device, a first n-type epitaxial layer (first semiconductor layer) 3 and the second n-type epitaxial layer (second semiconductor layer) 20 are formed and stacked on the upper layer of a p-type semiconductor substrate 1 and covered with an insulating film 40. In the region where elements are electrically insulated (isolated) by the p⁺-type buried layer 11, p⁺-type isolating layer 23, and element isolating insulating film 41, a first n⁻-type pocket 2 is formed from near an interface between the p-type semiconductor substrate 1 and a first n-type epitaxial layer 3 to the p-type semiconductor substrate 1. A second n⁻-type pocket 4 is formed in the first n-type epitaxial layer 3. The first n⁻-type pocket 2 and second n⁻-type pocket 4 are connected by having overlapping regions.

Also, a p⁺-type buried layer 10 is formed at the upper layer of the second n⁻-type pocket 4 and connected to the p-type well 21 which reaches from the surface of the second n-type epitaxial layer 20 to the p+-type buried layer 10. A gate electrode G is formed on the p-type well 21 via a gate insulating film 42. A source region comprised of a p+-type diffusion layer 28 and n+-type diffusion layer 29 is formed in the p-type well 21 at one side of the gate electrode G and is connected to the source electrode S. Also, an n-type diffusion layer 30 is formed in the second n-type epitaxial layer 20 at the other side of the gate electrode G and an n+-type diffusion layer 31 is formed inside it and is connected to a drain electrode D. From the above, a field effect transistor is configured wherein the p-type well 21 region lying below the gate insulating film 42 becomes a channel formation region.

The semiconductor device of the above third embodiment can be formed in the same way as that in the first embodiment except for the gate electrode G and source and drain regions. The first n⁻-type pocket 2 and second n⁻-type pocket 4 can be formed in a shorter time than in the process of forming an insulating film of the related art. Therefore, the time of the production process for forming the isolating layer can be shortened and the productivity can be improved.

The semiconductor device and the method for producing the same of the present invention are not limited to the above embodiments. For example, while a pnp junction type was explained as a bipolar transistor, an npn junction type may be used as well. In this case, it can be formed by replacing n-type impurities by p-type ones and p-type impurities by n-type ones. Also, an n-type was adopted as the first semiconductor layer in the embodiments, however, a p-type can be used as well. A variety of other modifications can be made to the present invention within the scope of the claims.

According to the present invention, second conductivity type first and second diffusion layers formed in the first conductivity type semiconductor substrate and first semiconductor layer can function as isolating layers to isolate a semiconductor substrate and a second semiconductor layer. Since an isolating layer of the related art which has a deep depth can be formed by separating it into two parts, that is, the first and second diffusion layers, the first and second diffusion layers can be formed to be shallow. The first and second diffusion layers can be formed in a shorter time than in the procedure of forming an isolating layer of the related art, so the time of the production process for forming an isolating layer can be shorter and the productivity improves.

According to a method for producing a semiconductor device of the present invention, an isolating layer having a deep depth of the related art can be formed by separating it into two parts, that is, the first and second diffusion layers, therefore the first and second diffusion layers can be formed to be shallow. The first and second diffusion layers can be formed in a shorter time than the procedure of forming an isolating layer of the related art, so the time of the production process for forming an isolating layer can be made shorter and the productivity improves. Since there is no need to raise the temperature of the heating process, there is no problem of the reactor core tube easily deforming.

What is claimed is:

1. A semiconductor device comprising:

a semiconductor substrate of a first conductivity type;

a first diffusion layer of a second conductivity type formed in the semiconductor substrate;

a first semiconductor layer formed on the semiconductor substrate;

a second diffusion layer of the second conductivity type formed in the first semiconductor layer and connected to the first diffusion layer; and a second semiconductor layer formed on the first semiconductor layer;

the second semiconductor layer being electrically isolated from the semiconductor substrate by the first diffusion layer and the second diffusion layer;

wherein the first semiconductor layer is a stacked layer of a plurality of semiconductor layers and the second diffusion layer comprises a plurality of diffusion layers of the second conductivity type formed in each of the plurality of semiconductor layers.

2. A semiconductor device comprising:

a semiconductor substrate of a first conductivity type;

a first diffusion layer of a second conductivity type formed on the semiconductor substrate;

a first semiconductor layer formed on the semiconductor substrate;

a second diffusion layer of the second conductivity type formed in the first semiconductor layer and connected to the first diffusion layer; and a second semiconductor layer formed on the first semiconductor layer;

the second semiconductor layer being electrically isolated from the semiconductor substrate by the first diffusion layer and the second diffusion layer;

wherein a bipolar transistor is formed, said bipolar transistor comprising a buried layer of the first conductivity type functioning as a collector region formed at an upper layer of the second diffusion layer, a well of the first conductivity type formed at an upper layer of the buried layer and connected to the buried layer, a base region of the second conductivity type formed in the well, and an emitter region of the first conductivity type formed in the base region.

* * * * *